(12) United States Patent
Cai et al.

(10) Patent No.: US 8,421,132 B2
(45) Date of Patent: Apr. 16, 2013

(54) POST-PLANARIZATION UV CURING OF STRESS INDUCING LAYERS IN REPLACEMENT GATE TRANSISTOR FABRICATION

(75) Inventors: Ming Cai, Hopewell Junction, NY (US); Dechao Guo, Fishkill, NY (US); Pranita Kulkarni, Slingerlands, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/103,149

(22) Filed: May 9, 2011

(65) Prior Publication Data
US 2012/0286375 A1  Nov. 15, 2012

(51) Int. Cl.
*H01L 29/76* (2006.01)
*H01L 21/336* (2006.01)

(52) U.S. Cl.
USPC .......... 257/288; 257/412; 257/E21.205; 257/E29.255; 438/197; 438/795

(58) Field of Classification Search .......... 257/288, 257/368, 388, 412, E21.177, E21.255, E29.255, 257/E29.26, E21.205; 438/197, 301, 791, 438/795
See application file for complete search history.

(56) References Cited

U.S. PATENT DOCUMENTS

| | | | |
|---|---|---|---|
| 6,033,963 A | 3/2000 | Huang et al. | |
| 6,465,309 B1 | 10/2002 | Xiang et al. | |
| 7,678,630 B2 * | 3/2010 | Lindsay | 438/197 |
| 7,803,706 B2 | 9/2010 | Idaka et al. | |
| 7,842,592 B2 | 11/2010 | Dyer et al. | |
| 7,911,001 B2 * | 3/2011 | Lee et al. | 257/369 |
| 8,004,047 B2 * | 8/2011 | Li | 257/371 |
| 8,293,605 B2 * | 10/2012 | Baars et al. | 438/275 |

(Continued)

FOREIGN PATENT DOCUMENTS

| | | |
|---|---|---|
| CN | 101641780 A | 2/2010 |
| CN | 101866859 A | 10/2010 |
| KR | 20030075745 A1 | 9/2003 |
| WO | 2008096587 A1 | 8/2008 |

OTHER PUBLICATIONS

C. Auth et al.,"45 nm High-k + Metal Gate Strain-Enhanced Transistors," 2008 Symposium on VLSI Technology, IEEE.

(Continued)

*Primary Examiner* — Tuan N. Quach
(74) *Attorney, Agent, or Firm* — Cantor Colburn LLP; Vazken Alexanian

(57) ABSTRACT

A method of forming a semiconductor structure includes forming a stress inducing layer over one or more partially completed field effect transistor (FET) devices disposed over a substrate, the one or more partially completed FET devices including sacrificial dummy gate structures; planarizing the stress inducing layer and removing the sacrificial dummy gate structures; and following the planarizing the stress inducing layer and removing the sacrificial dummy gate structures, performing an ultraviolet (UV) cure of the stress inducing layer so as to enhance a value of an initial applied stress by the stress inducing layer on channel regions of the one or more partially completed FET devices. A semiconductor structure includes a UV cured tensile nitride layer formed over the substrate and between gate structures of the NFET devices, with portions of the UV cured tensile nitride layer having a trapezoidal profile with a bottom end wider than a top end.

25 Claims, 15 Drawing Sheets

U.S. PATENT DOCUMENTS

| | | | |
|---|---|---|---|
| 2007/0096184 A1 | 5/2007 | Akamatsu | |
| 2008/0102571 A1 | 5/2008 | Pan | |
| 2008/0286916 A1 | 11/2008 | Luo et al. | |
| 2009/0035928 A1* | 2/2009 | Hegde et al. | 438/591 |
| 2009/0087974 A1 | 4/2009 | Waite et al. | |
| 2009/0179308 A1 | 7/2009 | Stapelmann | |
| 2009/0224293 A1* | 9/2009 | Miyanami | 257/288 |
| 2011/0049640 A1 | 3/2011 | Feustel et al. | |

OTHER PUBLICATIONS

Solid State Technology: Electro IQ—The Portal for Electronics Manufacturing, [online]; [retrieved on Mar. 11, 2011]; retrieved from the Internet http://www.electroiq.com/index/display/semiconductors-article-display/0982114112/articles/solid-state-technology/semiconductors/device-architecture/transistors/2010/november/cmp-for-metal-gate-integration-in-advanced-cmos-transistors.html.

Wang, Xingsheng, "Simulation Study of Scaling Design, Performance Characterization, Statistical Variability and Reliability of Decnanometer MOSFETs," PhD Thesis, 2010, University of Glasgow.

PR China International Search Report and Written Opinion for International Application No. PCT/IB2012050847; International Filing Date: Feb. 24, 2012; Date of mailing: Jul. 12, 2012, 11 pages.

* cited by examiner

US 8,421,132 B2

POST-PLANARIZATION UV CURING OF STRESS INDUCING LAYERS IN REPLACEMENT GATE TRANSISTOR FABRICATION

BACKGROUND

The present invention relates generally to semiconductor device manufacturing and, more particularly, to methods and structures for preserving tensile stress benefits of ultraviolet (UV) curing in replacement gate transistor fabrication.

Field effect transistors (FETs) are widely used in the electronics industry for switching, amplification, filtering, and other tasks related to both analog and digital electrical signals. Most common among these are metal-oxide-semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NFET and PFET) FETs are used to fabricate logic and other circuitry.

The source and drain regions of an FET are typically formed by adding dopants to targeted regions of a semiconductor body on either side of the channel. A gate structure is formed above the channel, which includes a gate dielectric located over the channel and a gate conductor above the gate dielectric. The gate dielectric is an insulator material, which prevents large leakage currents from flowing into the channel when a voltage is applied to the gate conductor, while allowing the applied gate voltage to set up a transverse electric field in the channel region in a controllable manner. Conventional MOS transistors typically include a gate dielectric formed by depositing or by growing silicon dioxide ($SiO_2$) or silicon oxynitride (SiON) over a silicon wafer surface, with doped polysilicon formed over the $SiO_2$ to act as the gate conductor.

Continuing trends in semiconductor device manufacturing include reduction in electrical device feature sizes (i.e., scaling), as well as improvements in device performance in terms of device switching speed and power consumption. MOS transistor performance may be improved by reducing the distance between the source and the drain regions under the gate conductor of the device, known as the gate or channel length, and by reducing the thickness of the layer of gate dielectric that is formed over the semiconductor surface. However, there are electrical and physical limitations on the extent to which the thickness of $SiO_2$ gate dielectrics can be reduced. For example, thin $SiO_2$ gate dielectrics are prone to gate tunneling leakage currents resulting from direct tunneling of electrons through the thin gate dielectric.

Accordingly, recent MOS and CMOS transistor scaling efforts have focused on high-k dielectric materials having dielectric constants greater than that of $SiO_2$ (e.g., greater than about 3.9). High-k dielectric materials can be formed in a thicker layer than scaled $SiO_2$, and yet still produce equivalent field effect performance. The relative electrical performance of such high-k dielectric materials is often expressed in terms equivalent oxide thickness (EOT), since the high-k material layer may be thicker, while still providing the equivalent electrical effect of a much thinner layer of $SiO_2$. Because the dielectric constant "k" is higher than silicon dioxide, a thicker high-k dielectric layer can be employed to mitigate tunneling leakage currents, while still achieving the equivalent electrical performance of a thinner layer of thermally grown $SiO_2$.

SUMMARY

In one aspect, a method of forming a semiconductor structure includes forming a stress inducing layer over one or more partially completed field effect transistor (FET) devices disposed over a substrate, the one or more partially completed FET devices including sacrificial dummy gate structures; planarizing the stress inducing layer and removing the sacrificial dummy gate structures; and following the planarizing the stress inducing layer and removing the sacrificial dummy gate structures, performing an ultraviolet (UV) cure of the stress inducing layer so as to enhance a value of an initial applied stress by the stress inducing layer on channel regions of the one or more partially completed FET devices.

In another aspect, a method of forming a semiconductor structure includes forming a tensile nitride layer over one or more partially completed n-type field effect transistor (NFET) devices disposed over a substrate, the one or more partially completed NFET devices including polysilicon sacrificial dummy gate structures; planarizing the tensile nitride layer and removing the polysilicon sacrificial dummy gate structures; filling trenches defined by the removing of the polysilicon sacrificial dummy gate structures with one or more metal gate layers; planarizing the one or more metal gate layers; and performing an ultraviolet (UV) cure of the tensile nitride layer so as to enhance a value of an initial applied stress by the tensile nitride layer on channel regions of the one or more partially completed NFET devices.

In still another aspect, a method of forming a semiconductor structure includes forming a tensile nitride layer over one or more partially completed n-type field effect transistor (NFET) devices disposed over a substrate, the one or more partially completed NFET devices including polysilicon sacrificial dummy gate structures; planarizing the tensile nitride layer and removing the polysilicon sacrificial dummy gate structures; performing an ultraviolet (UV) cure of the tensile nitride layer so as to enhance a value of an initial applied stress by the tensile nitride layer on channel regions of the one or more partially completed NFET devices; following the UV cure, filling trenches defined by the removing of the polysilicon sacrificial dummy gate structures with one or more metal gate layers; and planarizing the one or more metal gate layers.

In still another aspect, a semiconductor structure includes a plurality of n-type field effect transistor (NFET) devices disposed over a substrate; an ultraviolet (UV) cured tensile nitride layer formed over the substrate and between gate structures of the NFET devices, with portions of the UV cured tensile nitride layer having a trapezoidal profile with a bottom end thereof wider than a top end thereof; and the gate structures of the NFET devices also having a trapezoidal profile with a top end thereof wider than a bottom end thereof.

BRIEF DESCRIPTION OF THE SEVERAL VIEWS OF THE DRAWINGS

Referring to the exemplary drawings wherein like elements are numbered alike in the several Figures:

FIGS. 1 through 5 are cross sectional views illustrating a process flow for replacement metal gate transistor formation with ultraviolet (UV) curing of a stress layer, in which:

FIG. 1 illustrates the formation of a silicon nitride stress layer over a plurality of partially completed NFET devices;

FIG. 2 illustrates UV curing of the stress layer of FIG. 1, thereby increasing the tensile stress applied by the stress layer;

FIG. 3 illustrates planarizing of the stress layer of FIG. 2 and removal of dummy gate structures of the NFET devices, which reduces the tensile stress applied by the stress layer;

FIG. 4 illustrates the formation of metal gate material within trenches resulting from the dummy gate removal in FIG. 3;

FIG. 5 illustrates planarization of the metal gate material of FIG. 4;

FIGS. 6 through 10 are cross sectional views illustrating a process flow for replacement metal gate transistor formation with UV curing of a stress layer in accordance with an exemplary embodiment, in which:

FIG. 6 illustrates the formation of a silicon nitride stress layer over a plurality of partially completed NFET devices;

FIG. 7 illustrates planarizing of the stress layer of FIG. 6 and removal of dummy gate structures of the NFET devices;

FIG. 8 illustrates the formation of metal gate material within trenches resulting from the dummy gate removal in FIG. 7;

FIG. 9 illustrates planarization of the metal gate material of FIG. 8;

FIG. 10 illustrates UV curing of the stress layer of FIG. 9, thereby increasing the tensile stress applied by the stress layer;

FIGS. 11 through 15 are cross sectional views illustrating a process flow for replacement metal gate transistor formation with UV curing of a stress layer in accordance with another exemplary embodiment, in which:

FIG. 11 illustrates the formation of a silicon nitride stress layer over a plurality of partially completed NFET devices;

FIG. 12 illustrates planarizing of the stress layer of FIG. 11 and removal of dummy gate structures of the NFET devices;

FIG. 13 illustrates UV curing of the stress layer of FIG. 12 prior to metal gate filling, thereby increasing the tensile stress applied by the stress layer;

FIG. 14 illustrates the formation of metal gate material within trenches of the structure in FIG. 13; and FIG. 15 illustrates planarization of the metal gate material of FIG. 14.

DETAILED DESCRIPTION

Figure 1:
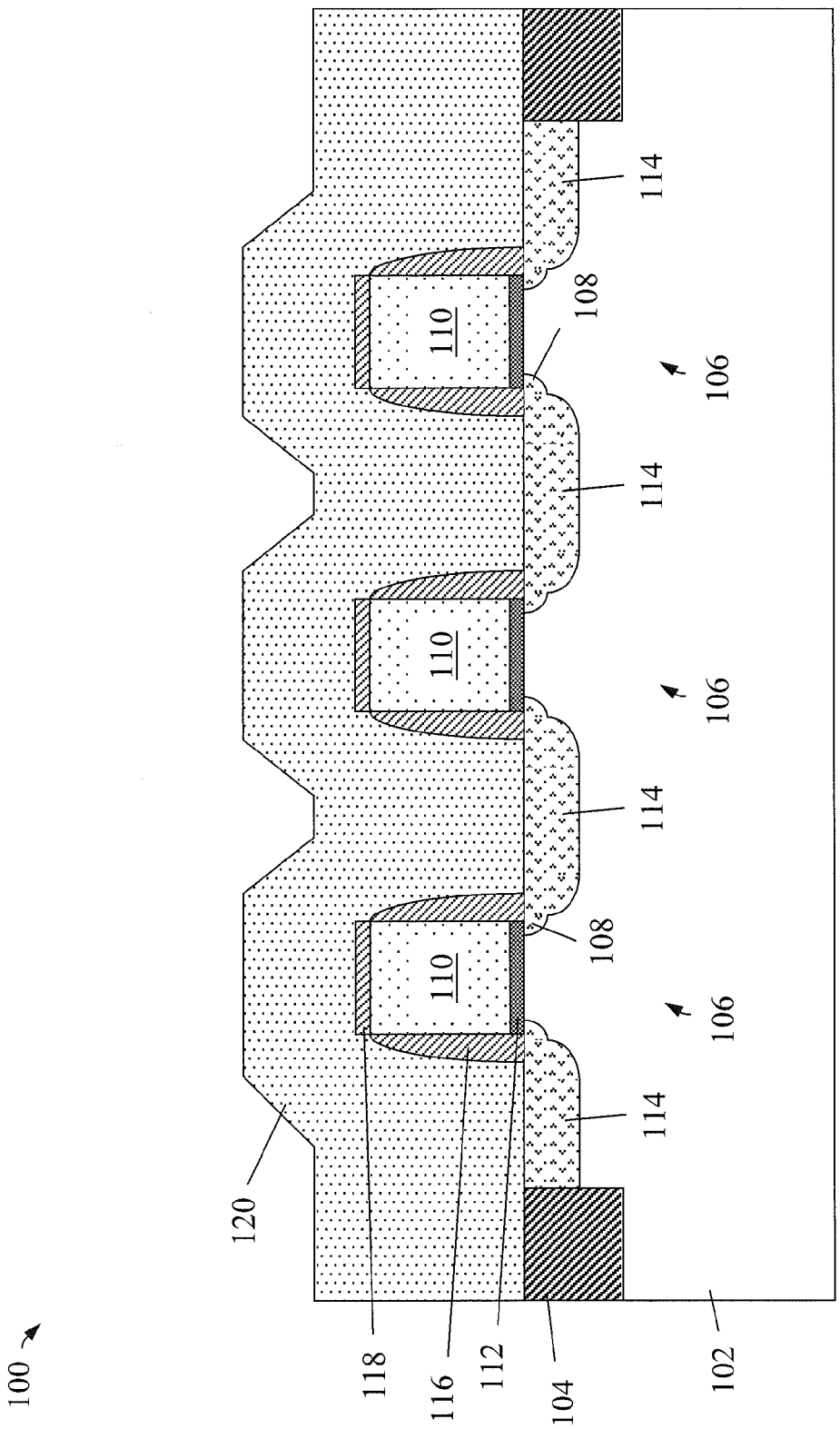

With respect to high-k metal gate (HKMG) technology, the two main approaches for introducing a metal gate into the standard CMOS process flow are a "gate first" process or a "gate last" process. The latter is also referred to as a "replacement gate" or replacement metal gate (RMG) process. In a gate first process, high-k dielectric and metal processing is completed prior to polysilicon gate deposition. The metal gate material is subtractively etched along with the polysilicon gate material prior to source and drain formation.

The RMG process architecture, on the other hand, avoids the problems of workfunction material stability seen in the gate first architecture. Here, a dummy gate structure is used to self-align the source and drain implant and anneals, followed by stripping out the dummy gate materials and replacing them with the high-k and metal gate materials. Although this process is more complex than the gate first technique, advantages of a replacement gate flow include the use of separate PMOS and NMOS metals for work function optimization. In addition, the two metals are not exposed to high temperatures, simplifying material selection. Further, the polysilicon gate removal can actually be used to enhance strain techniques, thereby increasing drive currents. The RMG process is currently the front-up approach for 22 nanometer (nm) CMOS technology due to the aforementioned workfunction constraints.

As is known in the art, the formation of stress liners (e.g., compressive liners for PFET devices and tensile liners for NFET devices) over FETs enhances the mobility of the majority carriers in a transistor channel. In the case of NFET devices, an exemplary stress liner material is silicon nitride (SiN), which provides a tensile stress on an NFET channel in the range of about 1.6 gigapascals (GPa). One technique that may be used in conjunction with silicon nitride tensile liner formation is the application of ultraviolet (UV) curing, such as produced by a laser light, for example. UV curing of a tensile stressed nitride film may enhance the tensile stress in the nitride film by reconfiguring silicon-hydrogen (Si—H)/nitrogen-hydrogen (N—H) bonds present in the nitride film. UV curing of nitride is performed by exposing the nitride to UV radiation, which has a wavelength in a range from about 10 nanometers (nm) to about 400 nm. The enhanced stress in the nitride film induces a corresponding enhanced stress in a channel of the FET over which the UV cured nitride film is located, increasing the carrier mobility in the FET channel.

Typically, the nitride layer deposition and UV curing process are combined together such that the nitride layer is cured prior to planarization thereof. However, in the case of a RMG process flow, the added benefit provided by UV curing may be reduced or neutralized altogether as a result of the chemical mechanical polishing (CMP) and dummy gate removal processes associated with RMG techniques. The uniaxial stress relaxation along the channel direction negates the benefits brought by the UV curing. By way of illustration, FIGS. 1 through 5 are cross sectional views illustrating a process flow for replacement metal gate transistor formation with ultraviolet (UV) curing of a stress layer.

As shown in FIG. 1, a semiconductor structure 100 includes a semiconductor substrate 102 having shallow trench isolation (STI) structures 104 formed therein. The semiconductor substrate 102 includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Where the semiconductor material of the semiconductor substrate 102 is a single crystalline silicon-containing semiconductor material, the single crystalline silicon-containing semiconductor material may be selected from single crystalline silicon, a single crystalline silicon carbon alloy, a single crystalline silicon germanium alloy, and a single crystalline silicon germanium carbon alloy.

In CMOS devices, the semiconductor material of the semiconductor substrate 102 may be appropriately doped either with p-type dopant atoms or with n-type dopant atoms. In the specific example depicted, the partially completed transistor devices depicted between the STI structures 104 are NFET devices 106, and thus the semiconductor 102 is doped with p-type atoms. The dopant concentration of the semiconductor substrate 102 may range from about $1.0 \times 10^{15}$ atoms/cm$^3$ to about $1.0 \times 10^{19}$ atoms/cm$^3$, and more specifically from about $1.0 \times 10^{16}$ atoms/cm$^3$ to about $3.0 \times 10^{18}$ atoms/cm$^3$, although lesser and greater dopant concentrations are contemplated herein also. In addition, the semiconductor substrate 102 may be a bulk substrate, a semiconductor-on-insulator or silicon-on-insulator (SOI) substrate, or a hybrid substrate. The shallow trench isolation structures 104 include a dielectric material such as silicon oxide or silicon nitride, and are formed by methods well known in the art.

As also illustrated in FIG. 1, the semiconductor structure 100 is an example of replacement gate FET technology. Thus, the device includes source and drain extension regions 108 formed by ion implantation with a dummy gate structure in place. The dummy gate structure may include sacrificial polysilicon material 110 formed on a gate dielectric layer 112. The gate dielectric layer 112 may, in some embodiments, also be sacrificial and thus form a part of the dummy gate structure. Alternatively, the gate dielectric layer 112 may be a permanent gate dielectric layer and include a high-k material such as hafnium oxide ($HfO_2$) with an $SiO_2$ interfacial layer, for example.

The source and drain extension regions 108 have a doping of the opposite conductivity type of the doping of the substrate 102. Thus, in the NFET example shown, since the substrate 102 has a p-type doping, the source and drain extension regions 108 have an n-type doping. Source and drain regions 114 are also depicted in FIG. 1, which are formed, for example, by ion implantation of the same conductivity type as the extension regions 106. The source and drain regions 114 are implanted with both the dummy gate structure and sidewall spacers 116 in place. The sidewall spacers 116 are formed, for example, by deposition of a conformal dielectric material layer (e.g., and oxygen-impermeable material such as silicon nitride) followed by an anisotropic ion etching. The portions of the dielectric material layer that are formed directly on the sidewalls of the dummy gate structure remain after the anisotropic etch to constitute the sidewall spacers 116. A protective hardmask 118 is also shown atop the sacrificial polysilicon 110, which may be either the same or a different material than the sidewall spacers 116.

Figure 2:
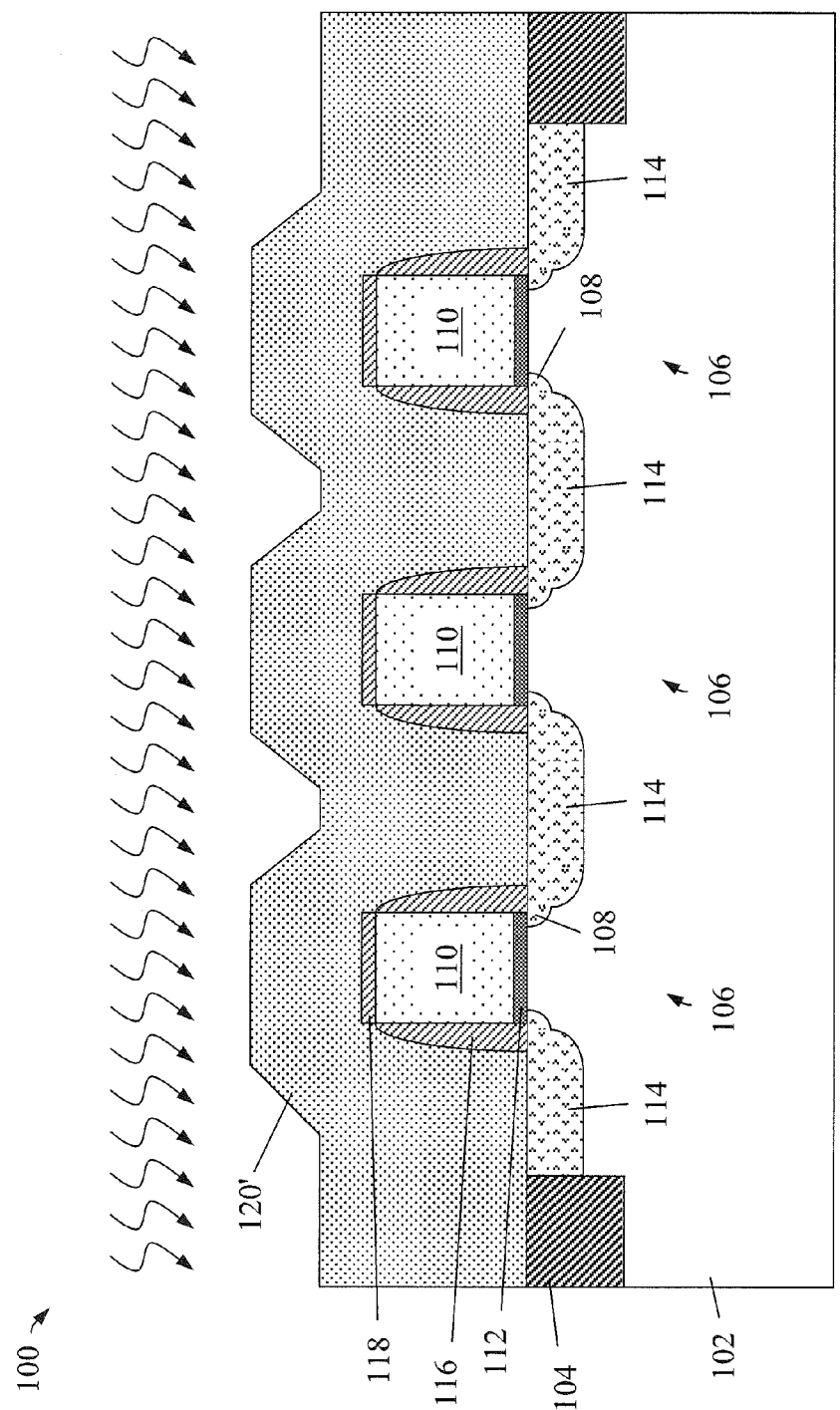

As further shown in FIG. 1, a tensile nitride layer 120, such as SiN for example, is formed over the entire structure 100. The tensile nitride layer 120 may be formed, for example, by physical vapor deposition (PVD), chemical vapor deposition (CVD), plasma enhanced CVD (PECVD), high density plasma CVD (HDPCVD) and spin-on techniques. As initially deposited, the nitride layer 120 may provide a tensile stress on the order of about 0.7 gigapascals (GPa). Then, as shown in FIG. 2, the nitride layer 120 is cured with UV radiation as indicated by the curved arrows so as to enhance the stress characteristics thereof, with the enhanced stress nitride layer being designated by 120'. The enhanced stress nitride layer 120', by virtue of the UV curing, may provide an increased tensile stress on the order of about 1.6 GPa.

Figure 3:
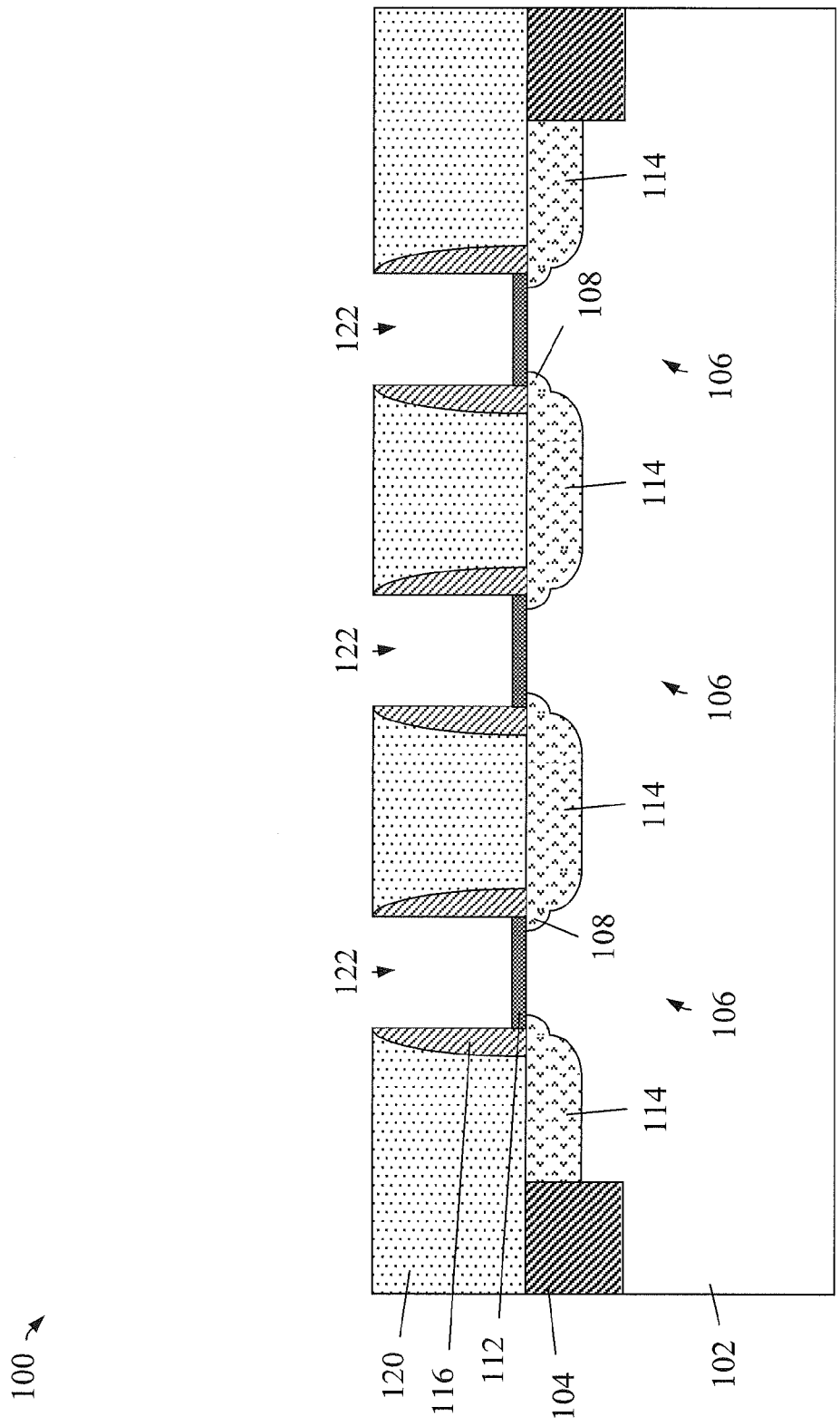
Figure 4:
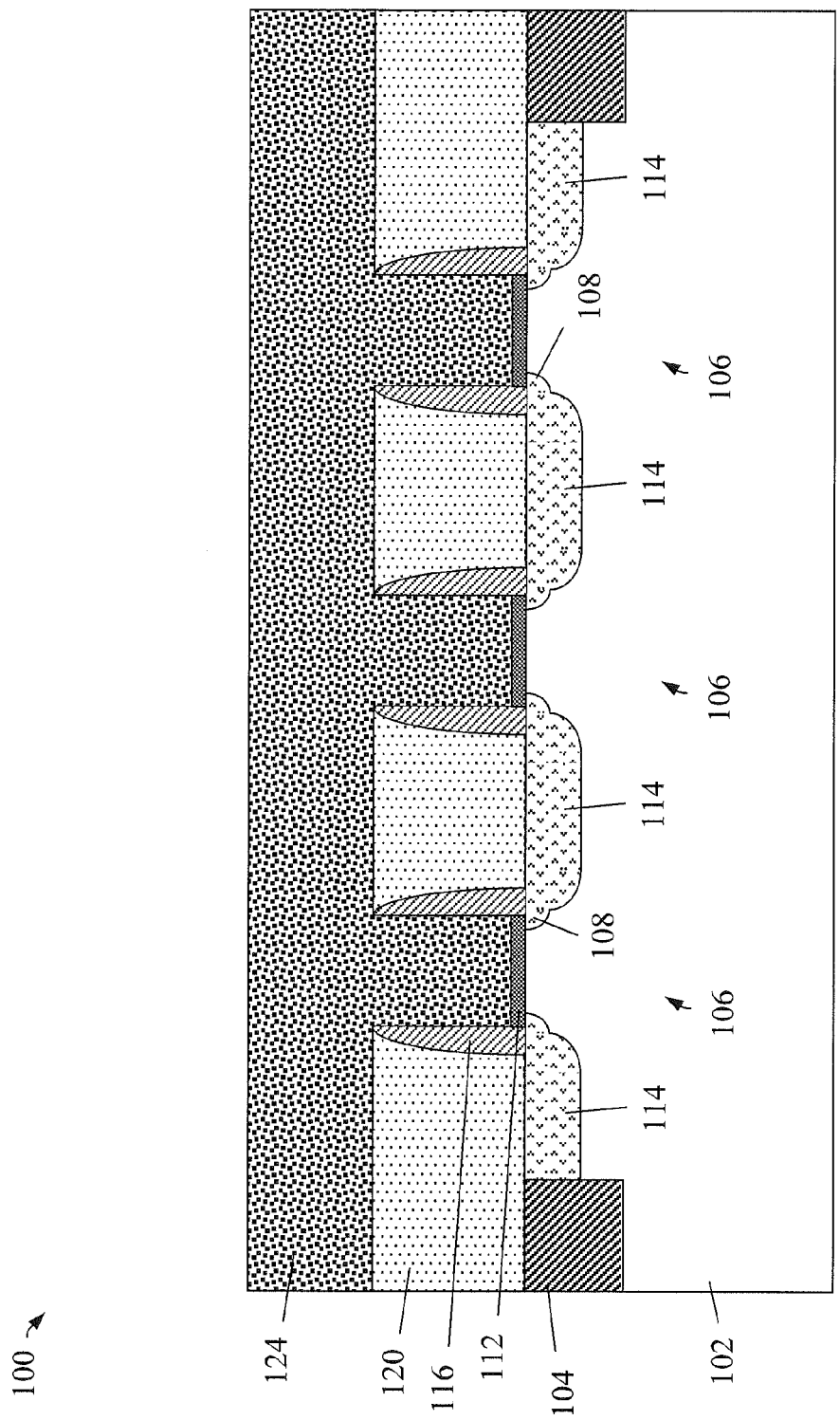

As then shown in FIG. 3, the enhanced stress nitride layer 120' is planarized such as by CMP, followed by removal of at least the sacrificial polysilicon 110 of the dummy gate structures, so as to form trenches 122. It will be noted that the nitride layer is now once again designated by reference numeral 120 in FIG. 3, which reflects the resulting decrease in stress due to planarization of the stress layer following the curing (e.g., reduced to about 1.1 Gpa or below). In accordance with RMG processing, one or more metal gate layers (depicted generally by 124) are formed over the device, as shown in FIG. 4. For example, for an NFET device, the metal gate layers 124 may include workfunction setting metal layers selected to set the workfunction around the silicon conduction band edge, such as for example, titanium nitride, tantalum nitride, titanium aluminum, titanium aluminum nitride, tantalum aluminum, tantalum aluminum nitride, hathium silicon alloy, hathium nitride, or tantalum carbide. Again, where the gate dielectric layer 112 is a sacrificial layer, a new gate dielectric layer (e.g., high-k) would be formed prior to deposition of the metal gate layers 124, followed by a 600° C. anneal for high-k dielectric densification.

Figure 5:
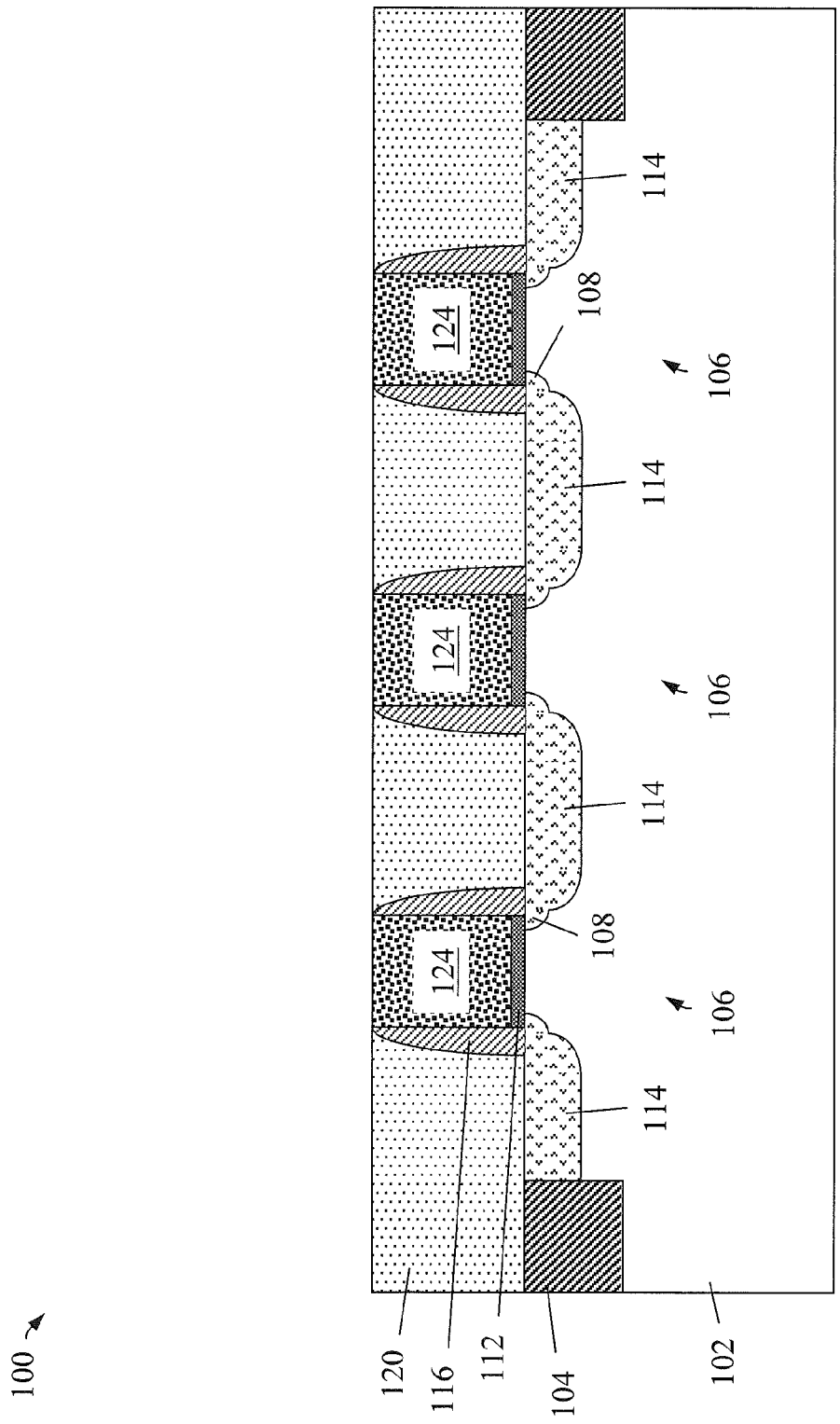

Then, as shown in FIG. 5, the metal gate layers 124 are planarized, following which CMOS device processing may continue as shown in the art. As should be appreciated, however, the benefits of UV curing of the nitride layer 120 may be effectively neutralized as a result of the above described RMG process flow.

Accordingly, disclosed herein are methods and structures for preserving stress benefits of ultraviolet (UV) curing in replacement gate transistor fabrication. By separating the nitride deposition and UV curing process such that curing is performed after nitride layer deposition and dummy gate removal, the stress benefit of the UV curing may be fully preserved. In one specific embodiment described below, the nitride morphology change associated with film shrinkage resulting from a UV process provides an additional benefit with respect to uniform gate metal deposition. As the gate length further scales, the gap fill becomes increasingly challenging, and this embodiment provides a solution to alleviate the issue.

Figure 6:
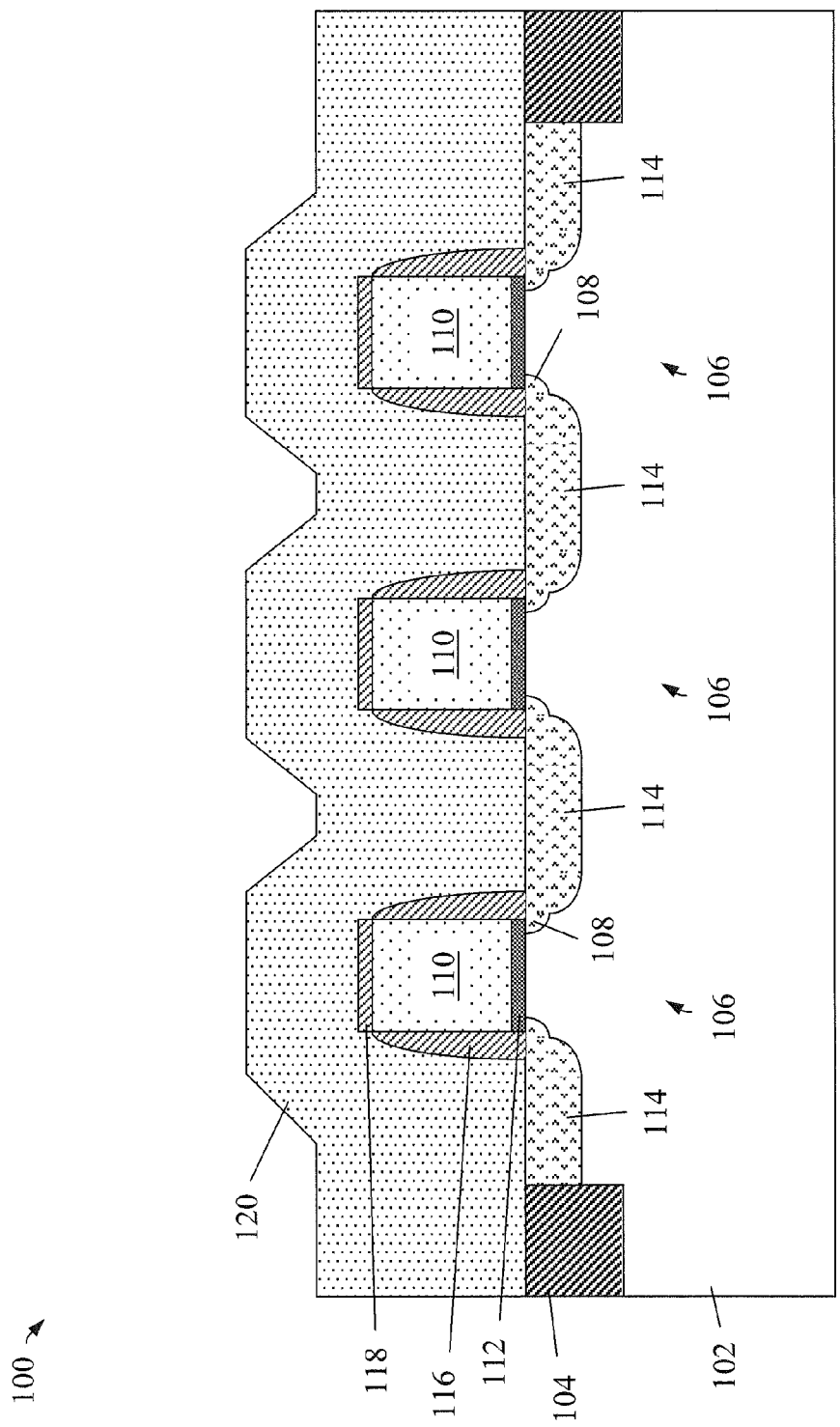
Figure 7:
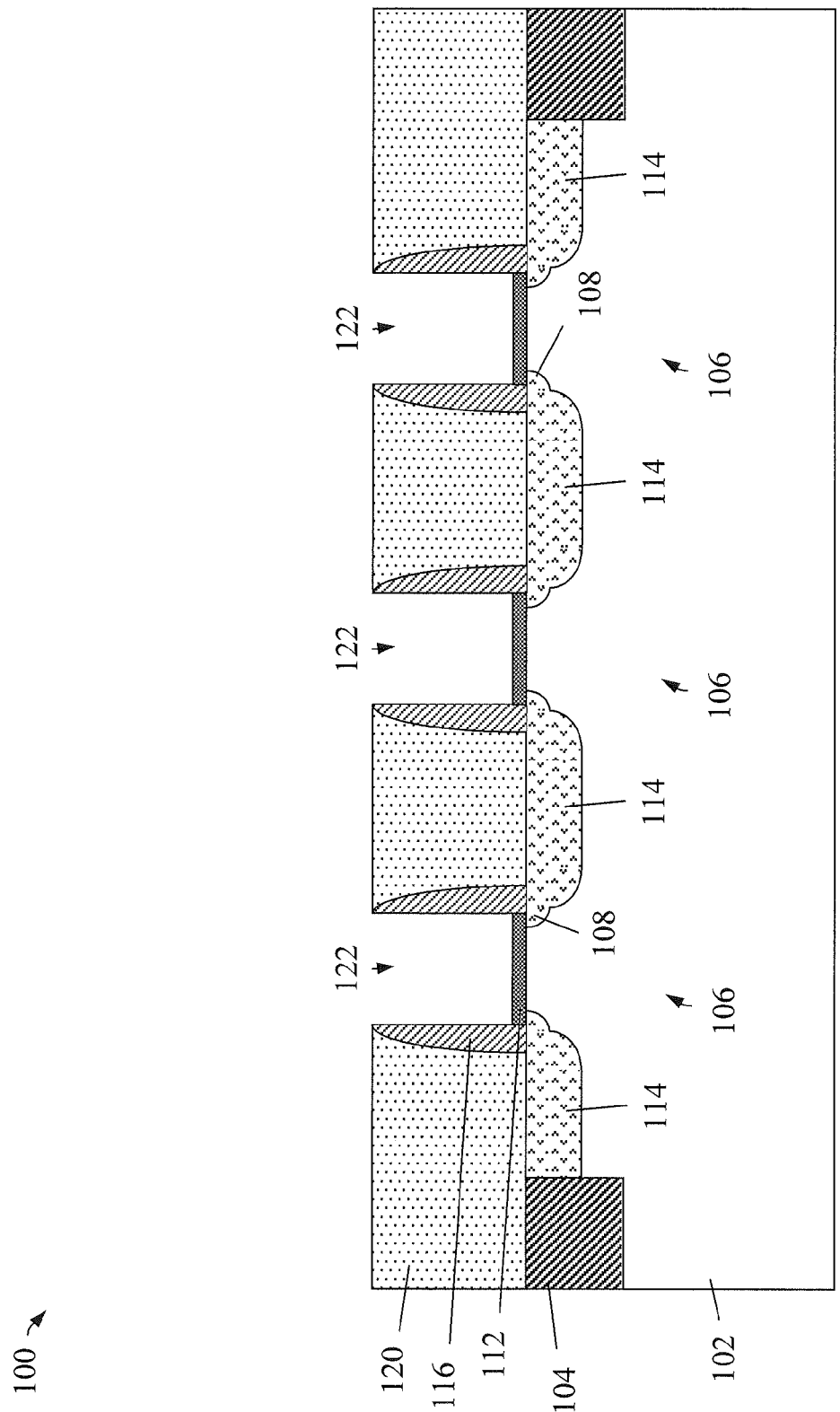

Referring generally now to FIGS. 6 through 10 there is shown a sequence of cross sectional views illustrating a process flow for replacement metal gate transistor formation with UV curing of a stress layer in accordance with an exemplary embodiment. FIG. 6 illustrates a point in processing substantially similar to that of FIG. 1, in which a tensile nitride layer 120, such as SiN for example, is formed over the entire structure 100 of partially formed NFET devices 106 with dummy gate structures. However, instead of performing the UV curing of the nitride layer 120 at this point in the process, the nitride layer 120 is instead planarized, such as by CMP, followed by removal of at least the sacrificial polysilicon 110 of the dummy gate structure, as shown in FIG. 7.

Figure 8:
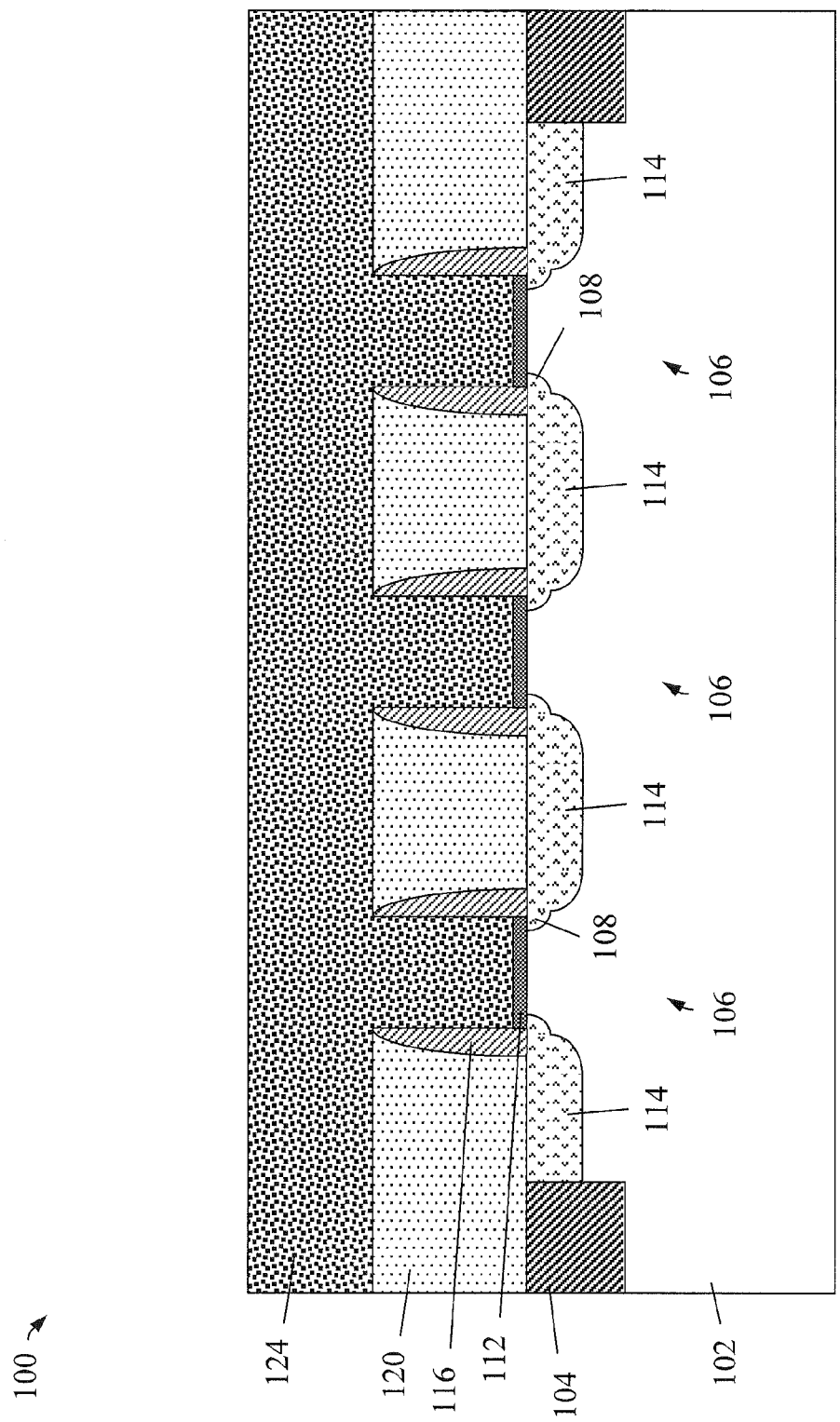
Figure 9:
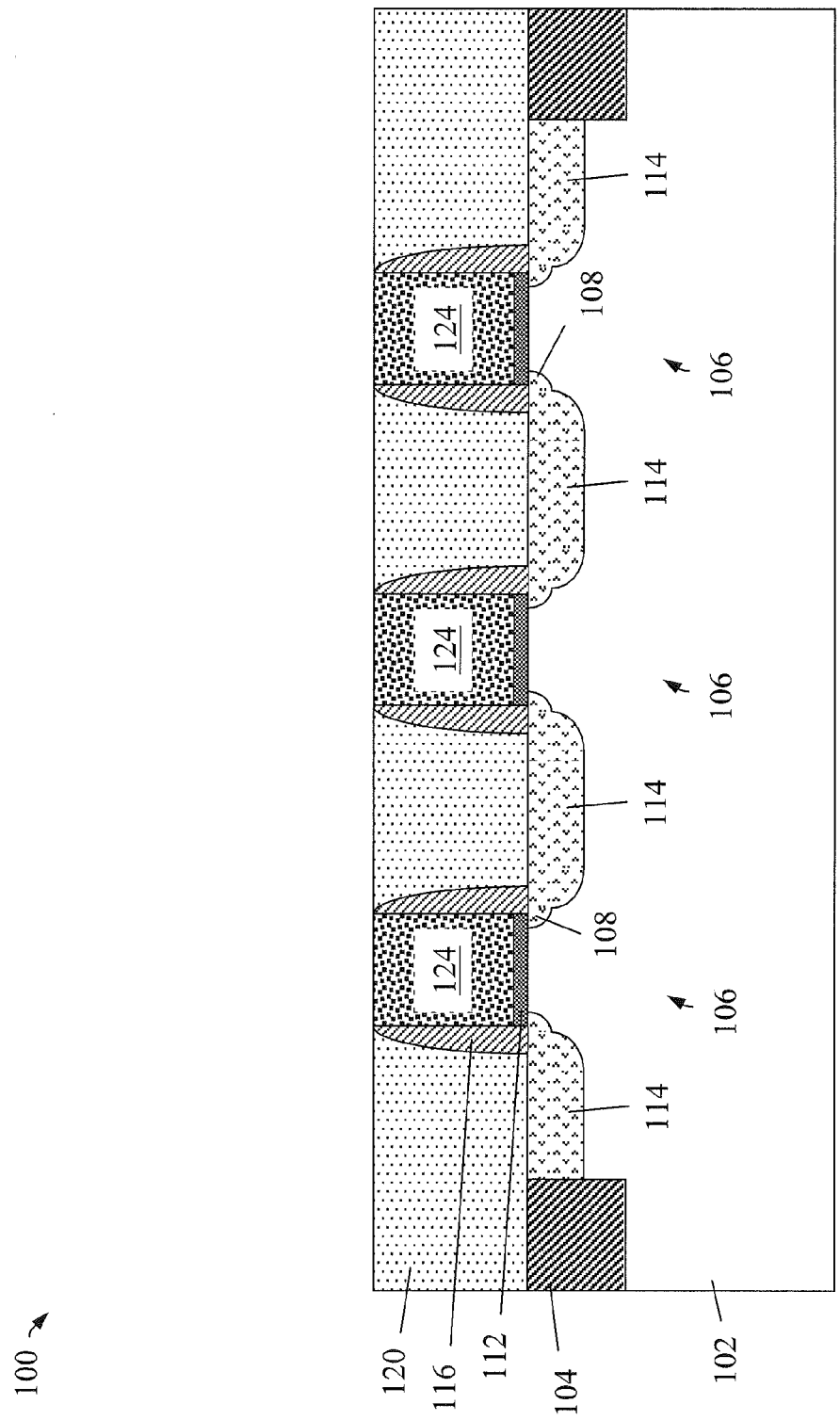
Figure 10:
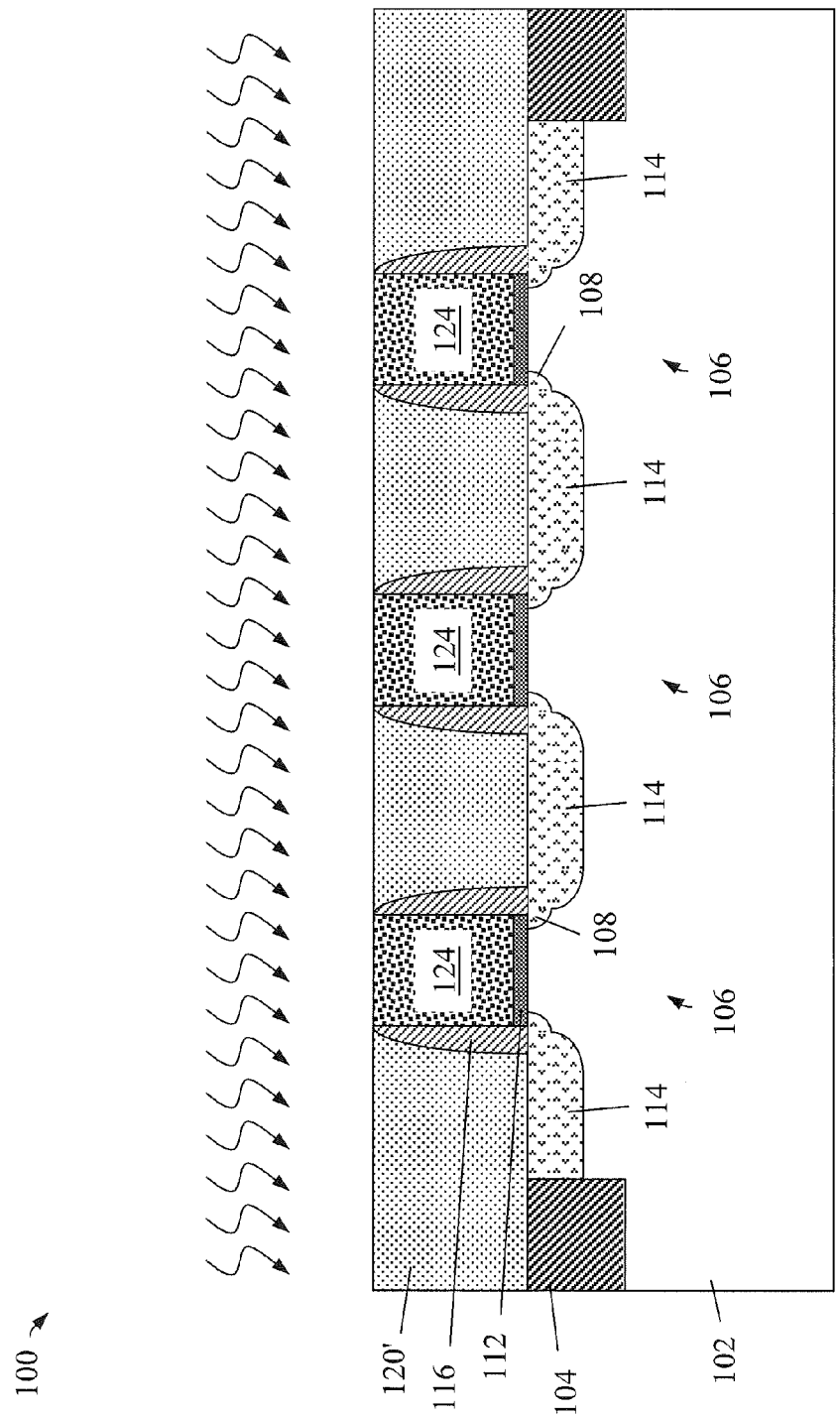

Then, as shown in FIG. 8, one or more metal gate layers (depicted generally by 124) are formed over the device 100, including the trenches 122 left by the sacrificial polysilicon removal. Again, at this point, the nitride layer 120 has not yet been subjected to UV curing. In FIG. 9, the metal gate layers 124 are planarized, thereby defining RMG formed NFET devices 106. With the metal gate structures in place, the nitride layer 120 is then subjected to UV curing as shown in FIG. 10. The UV curing results in enhancement of the applied stress of the nitride layer, now depicted as 120' in FIG. 10. Again, as a result of the UV curing, the applied uniaxial tensile stress by the enhanced nitride layer 120' increases from about 0.7 GPa to about 1.6 GPa. Moreover, since the enhanced nitride layer 120' has already been planarized, the device 100 is prepared for further CMOS processing steps that do not affect the integrity or effectiveness of the applied stress of the enhanced nitride layer 120'.

Figure 11:
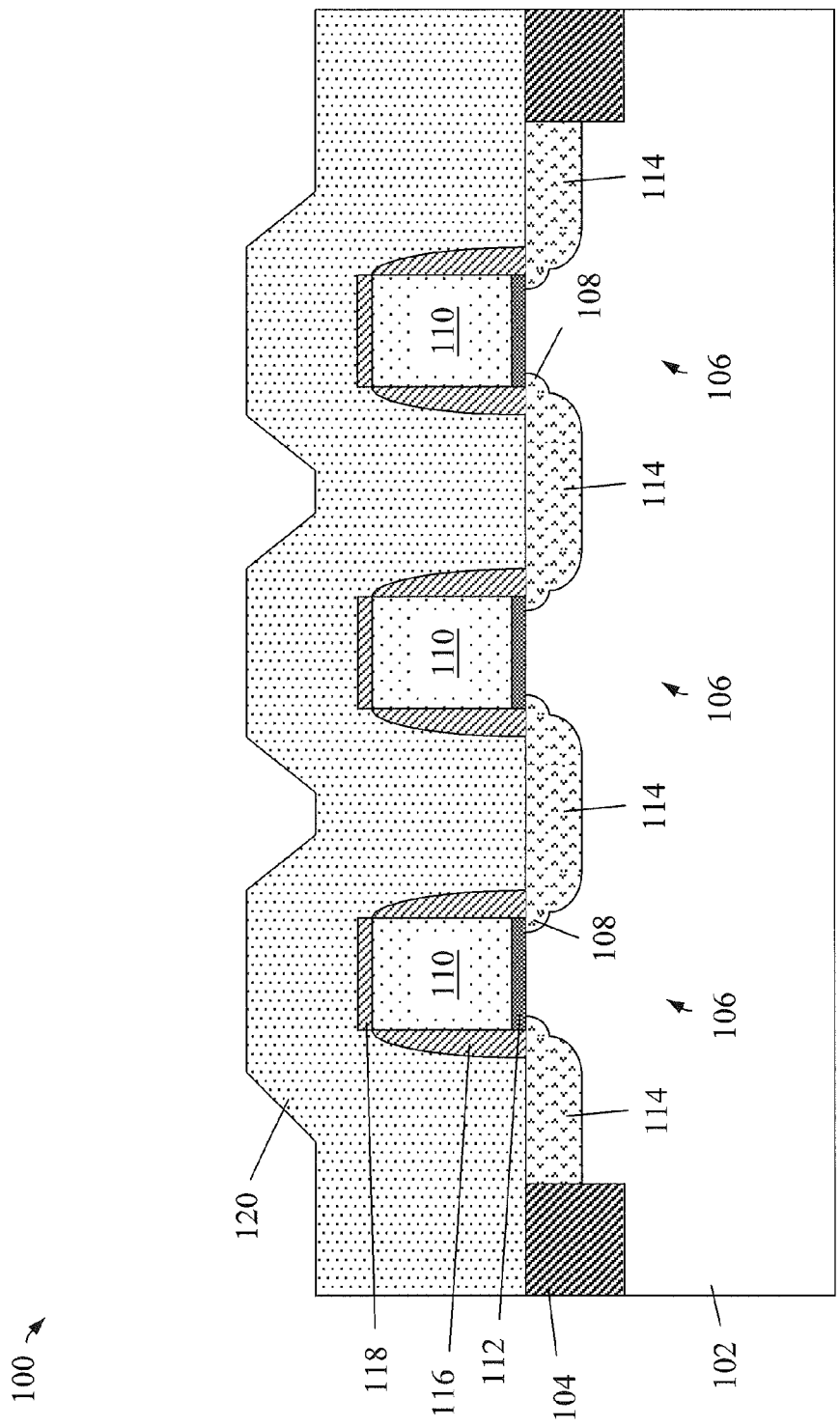
Figure 12:
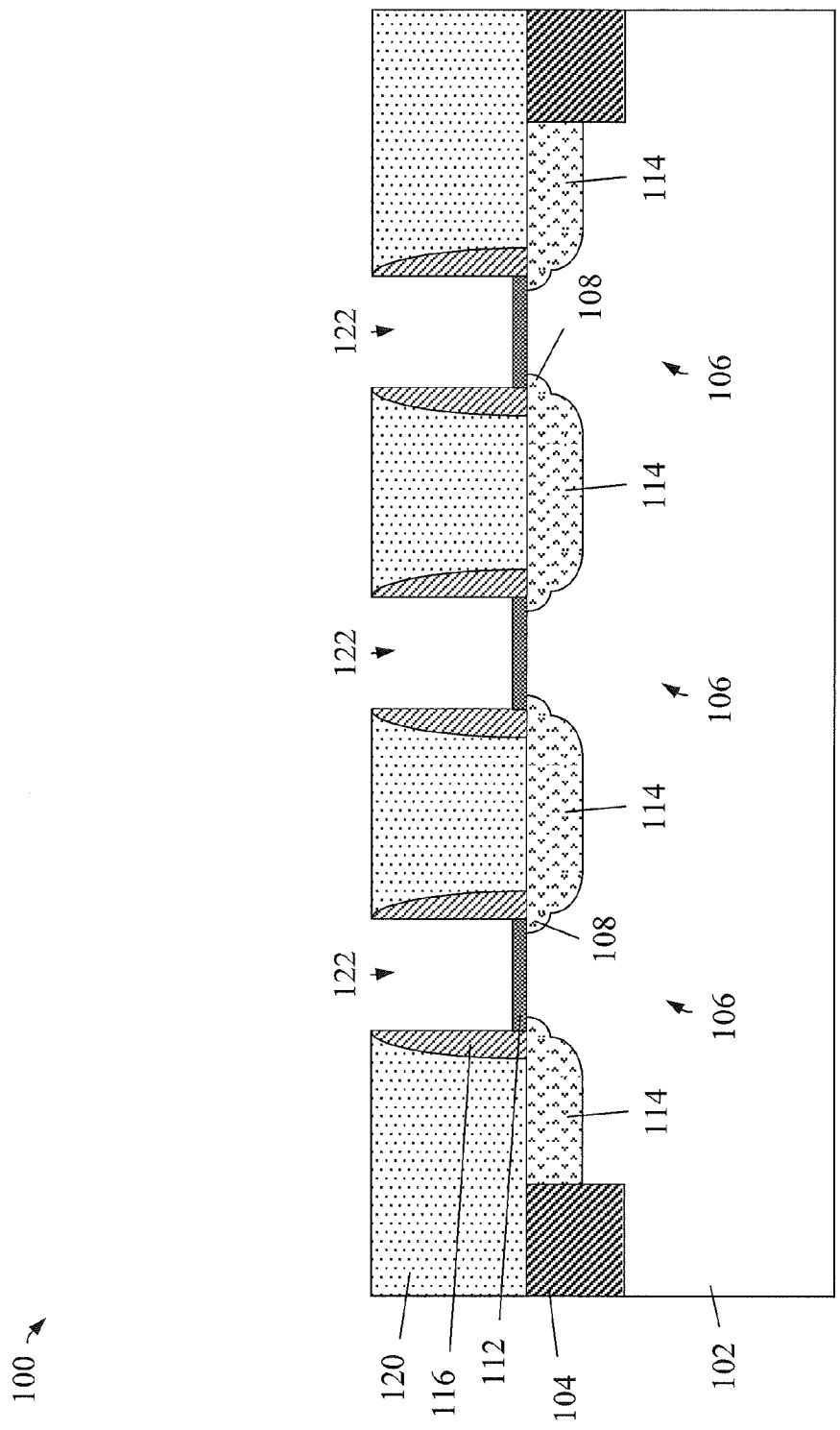

Referring generally now to FIGS. 11 through 15 there is shown a sequence of cross sectional views illustrating a process flow for replacement metal gate transistor formation with UV curing of a stress layer in accordance with an exemplary embodiment. FIG. 11 illustrates a point in processing substantially similar to that of FIG. 1, in which a tensile nitride layer 120, such as SiN for example, is formed over the entire structure 100 of partially formed NFET devices 106 with dummy gate structures. As is the case with the previously described embodiment, instead of performing the UV curing of the nitride layer 120 at this point in the process, the nitride layer 120 is instead planarized, such as by CMP, followed by removal of at least the sacrificial polysilicon 110 of the dummy gate structure, as shown in FIG. 12.

Figure 13:
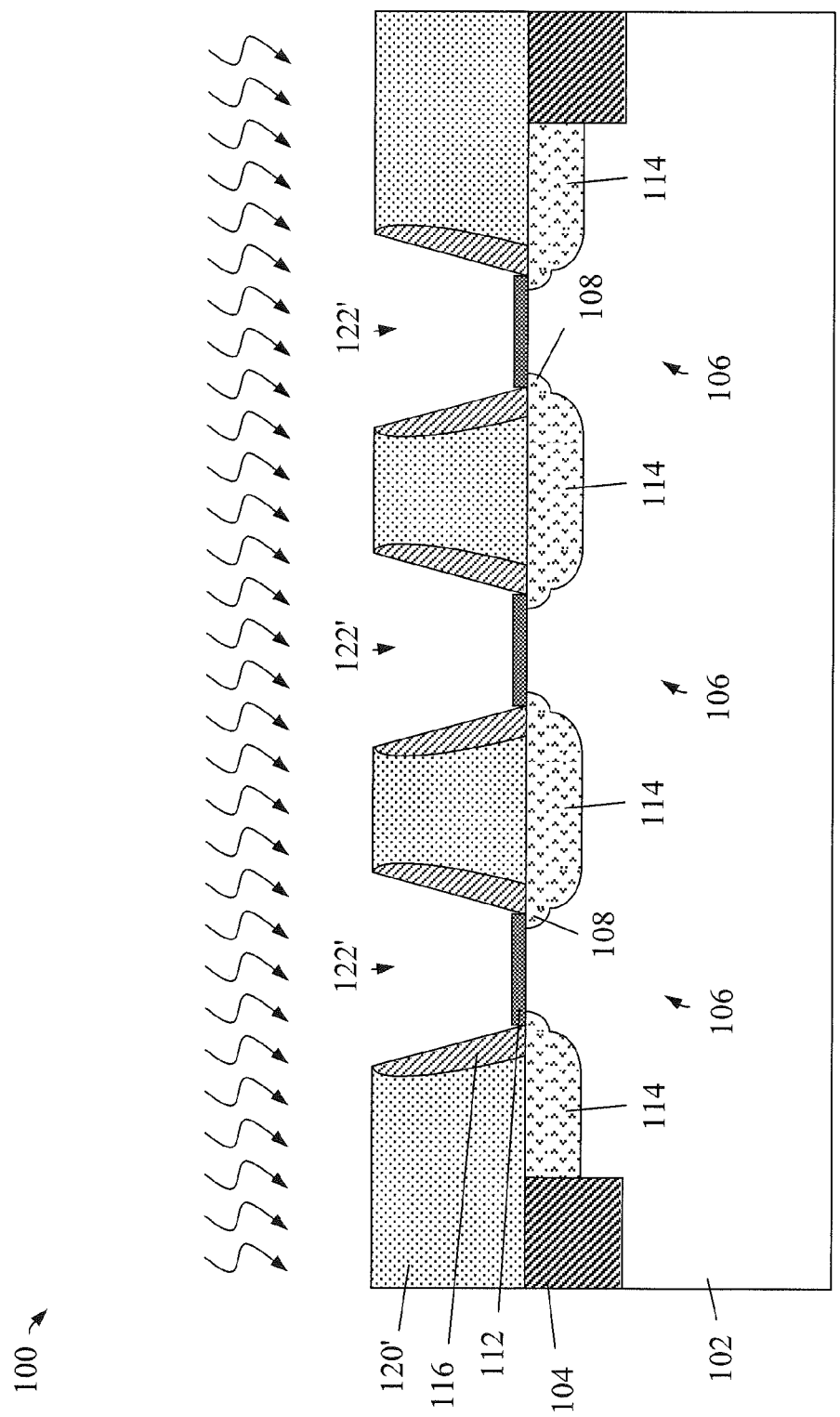

However, in contrast to the embodiment of FIGS. 6 through 10, in this embodiment, the nitride layer 120 is subject to UV curing prior to metal fill of the trenches 122, as reflected in FIG. 13. Here, it will be noted that in addition to increasing the applied stress of the enhanced nitride layer 120', the UV curing also causes a volume shrinkage (e.g., about 10%) of enhanced nitride layer 120', as the film gets denser. In particular, the UV cure performed after the sacrificial polysilicon removal and before replacement gate metal deposition results in a trapezoidal profile for both the enhanced nitride layer 120' as well as the resulting modified trench 122' profile. Whereas the trapezoidal profile of the enhanced nitride layer 120' is wider at the base and narrower at the top, the trapezoidal profile of the modified trenches 122' is narrower at the bottom end and wider at the top end.

Figure 14:
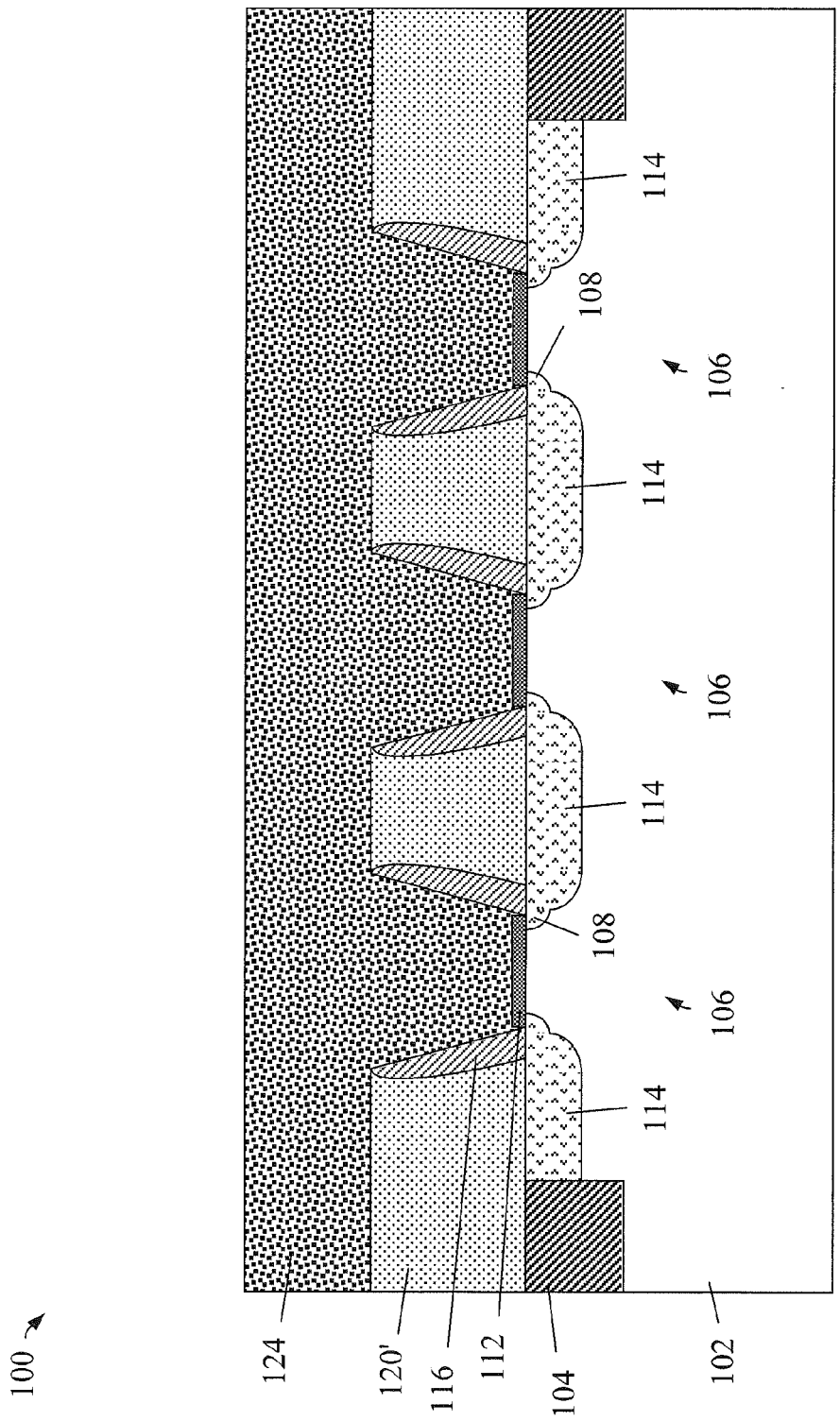
Figure 15:
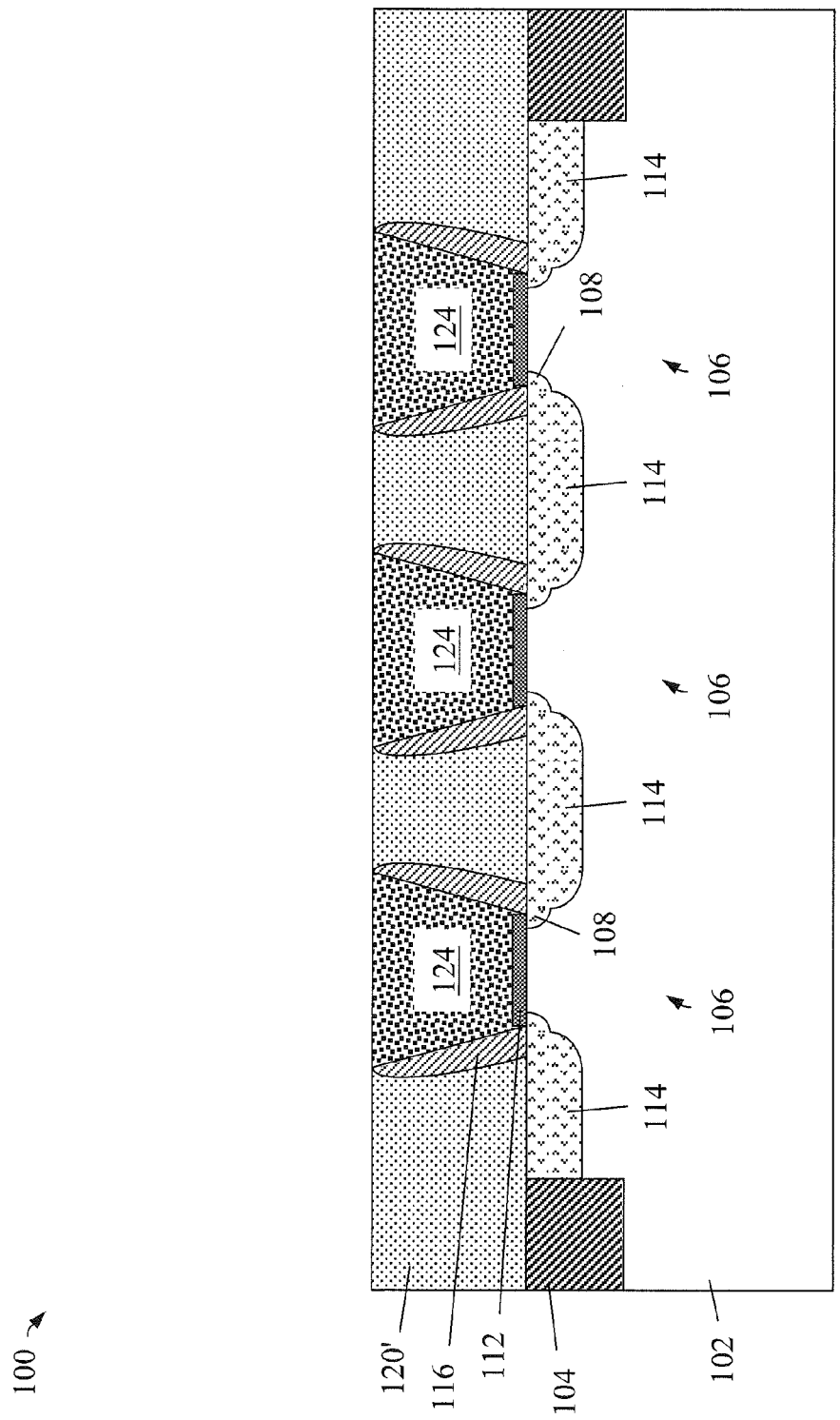

Such a profile is advantageous for a subsequent metal gate fill process, as shown in FIG. 14. Here, the one or more metal gate layers 124 are formed over the device 100, including the modified trenches 122' defined by both the sacrificial polysilicon removal and the UV curing. In contrast to a substantially vertical trench profile or a trench profile that is narrower at the top, the trapezoidal trench profile in which the volume shrinkage of a nitride layer cause a widened top of trench promotes better metal fill coverage within the modified trenches 122' by avoiding layer pinch-off and void formation within the metal gate structure. Finally, as shown in FIG. 15, the metal gate layers 124 are planarized, thereby defining RMG formed NFET devices 106.

As will thus be appreciated, by not performing UV curing simultaneously or immediately following deposition of the nitride liner, and instead performing at least nitride layer CMP and dummy gate removal first the enhanced stress benefits offered by the UV curing may be maintained throughout the remainder of device processing. Additionally, by performing the UV curing post-planarization/dummy gate removal and before metal gate fill, the resulting volume shrinkage and trapezoidal profile of the nitride layer and trenches leads to better metal fill conditions.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a semiconductor structure, the method comprising:
   forming a stress inducing layer over one or more partially completed field effect transistor (FET) devices disposed over a substrate, the one or more partially completed FET devices including sacrificial dummy gate structures;
   planarizing the stress inducing layer and removing the sacrificial dummy gate structures; and
   following the planarizing the stress inducing layer and removing the sacrificial dummy gate structures, performing an ultraviolet (UV) cure of the stress inducing layer so as to enhance a value of an initial applied stress by the stress inducing layer on channel regions of the one or more partially completed FET devices.

2. The method of claim 1, wherein the stress inducing layer comprises a tensile nitride layer, and the one or more partially completed FET devices comprise n-type FET (NFET) devices.

3. The method of claim 2, further comprising filling trenches defined by the removing of the sacrificial dummy gate structures with one or more metal gate layers.

4. The method of claim 3, further comprising planarizing the one or more metal gate layers.

5. The method of claim 3, wherein the UV cure is performed following the filling the trenches and planarizing the one or more metal gate layers.

6. The method of claim 3, wherein the UV cure is performed prior to filling the trenches with the one or more metal gate layers so as to cause the stress inducing layer and the trenches to assume a trapezoidal profile.

7. The method of claim 6, wherein the trapezoidal profile of the trenches is such that the trenches are narrower at a bottom end thereof and wider at a top end thereof.

8. The method of claim 3, further comprising:
   forming a replacement, high dielectric constant (high-k) layer in the trenches prior to the filling with the one or more metal gate layers.

9. A method of forming a semiconductor structure, the method comprising:
   forming a tensile nitride layer over one or more partially completed n-type field effect transistor (NFET) devices disposed over a substrate, the one or more partially completed NFET devices including polysilicon sacrificial dummy gate structures;
   planarizing the tensile nitride layer and removing the polysilicon sacrificial dummy gate structures;
   filling trenches defined by the removing of the polysilicon sacrificial dummy gate structures with one or more metal gate layers;
   planarizing the one or more metal gate layers; and
   following the planarizing of the tensile nitride layer, the removing of the polysilicon sacrificial dummy gate structures, and the planarizing of the one or more metal gate layers, performing an ultraviolet (UV) cure of the tensile nitride layer so as to enhance a value of an initial applied stress by the tensile nitride layer on channel regions of the one or more partially completed NFET devices.

10. The method of claim 9, wherein the tensile nitride layer comprises a silicon nitride layer.

11. The method of claim 10, wherein the initial applied stress by the tensile nitride layer is on the order of about 0.7 gigapascals (GPa), and the enhanced value of the tensile stress is on the order of about 1.6 GPa.

12. The method of claim 9, wherein the one or more metal gate layers comprise one or more of: titanium nitride, tantalum nitride, titanium aluminum, titanium aluminum nitride, tantalum aluminum, tantalum aluminum nitride, hafnium silicon alloy, hafnium nitride, and tantalum carbide.

13. The method of claim 9, further comprising:
   forming a replacement, high dielectric constant (high-k) layer and in the trenches prior to the filling with the one or more metal gate layers, the high-k layer comprising hafnium oxide ($HfO_2$) with an $SiO_2$ interfacial layer; and
   annealing the high-k layer for densification thereof.

14. A method of forming a semiconductor structure, the method comprising:
   forming a tensile nitride layer over one or more partially completed n-type field effect transistor (NFET) devices disposed over a substrate, the one or more partially completed NFET devices including polysilicon sacrificial dummy gate structures;
   planarizing the tensile nitride layer and removing the polysilicon sacrificial dummy gate structures;
   following the planarizing of the tensile nitride layer and removing of the polysilicon sacrificial dummy gate structures, performing an ultraviolet (UV) cure of the tensile nitride layer so as to enhance a value of an initial applied stress by the tensile nitride layer on channel regions of the one or more partially completed NFET devices;

following the UV cure, filling trenches defined by the removing of the polysilicon sacrificial dummy gate structures with one or more metal gate layers; and planarizing the one or more metal gate layers.

15. The method of claim 14, wherein the tensile nitride layer comprises a silicon nitride layer.

16. The method of claim 14, wherein the one or more metal gate layers comprise one or more of: titanium nitride, tantalum nitride, titanium aluminum, titanium aluminum nitride, tantalum aluminum, tantalum aluminum nitride, hafnium silicon alloy, hafnium nitride, and tantalum carbide.

17. The method of claim 14, further comprising:

forming a replacement, high dielectric constant (high-k) layer and in the trenches prior to the filling with the one or more metal gate layers, the high-k layer comprising hafnium oxide ($HfO_2$) with an $SiO_2$ interfacial layer; and annealing the high-k layer for densification thereof.

18. A method of forming a semiconductor structure, the method comprising:

forming a tensile nitride layer over one or more partially completed n-type field effect transistor (NFET) devices disposed over a substrate, the one or more partially completed NFET devices including polysilicon sacrificial dummy gate structures;

planarizing the tensile nitride layer and removing the polysilicon sacrificial dummy gate structures;

performing an ultraviolet UV cure of the tensile nitride layer so as to enhance a value of an initial applied stress by the tensile nitride layer on channel regions of the one or more partially completed NFET devices;

following the UV cure, filling trenches defined by the removing of the polysilicon sacrificial dummy gate structures with one or more metal gate layers; and planarizing the one or more metal gate layers;

wherein the UV cure causes the tensile nitride layer and the trenches to assume a trapezoidal profile.

19. The method of claim 18, wherein the trapezoidal profile of the trenches is such that the trenches are narrower at a bottom end thereof and wider at a top end thereof.

20. The method of claim 18, wherein the initial applied stress by the tensile nitride layer is on the order of about 0.7 gigapascals (GPa), and the enhanced value of the tensile stress is on the order of about 1.6 GPa.

21. A semiconductor structure, comprising:

a plurality of n-type field effect transistor (NFET) devices disposed over a substrate;

an ultraviolet (UV) cured tensile nitride layer formed over the substrate and between gate structures of the NFET devices, with portions of the UV cured tensile nitride layer having a trapezoidal profile with a bottom end thereof wider than a top end thereof; and the gate structures of the NFET devices also having a trapezoidal profile with a top end thereof wider than a bottom end thereof.

22. The structure of claim 21, wherein the tensile nitride layer comprises a silicon nitride layer.

23. The structure of claim 21, wherein tensile nitride layer provides a tensile stress on the order of about 1.6 gigapascals (GPa).

24. The structure of claim 21, wherein the gate structures comprise metal gate structures.

25. The method of claim 24, wherein the metal gate structures comprise one or more of: titanium nitride, tantalum nitride, titanium aluminum, titanium aluminum nitride, tantalum aluminum, tantalum aluminum nitride, hafnium silicon alloy, hafnium nitride, and tantalum carbide.

* * * * *